United States Patent

Ito

Patent Number: 6,086,670
Date of Patent: Jul. 11, 2000

[54] SILICON WAFER AND METHOD FOR PRODUCING THE SAME

[75] Inventor: Makoto Ito, Saga, Japan

[73] Assignee: Sumitomo Sitix Corporation, Amagasaki, Japan

[21] Appl. No.: 09/216,853

[22] Filed: Dec. 21, 1998

[30] Foreign Application Priority Data

Dec. 24, 1997 [JP] Japan .................... 9-367434

[51] Int. Cl.$^7$ .................... C30B 15/36
[52] U.S. Cl. .................... 117/13; 117/14; 117/35; 117/902
[58] Field of Search .................... 117/13, 14, 35, 117/902

[56] References Cited

U.S. PATENT DOCUMENTS

| | | | |
|---|---|---|---|
| 3,655,345 | 4/1972 | Longo et al. | 23/301 SP |
| 5,408,951 | 4/1995 | Tamida | 117/17 |

FOREIGN PATENT DOCUMENTS 4-266065 of 1992 Japan .

OTHER PUBLICATIONS

Wolf et al., Silicon Processing for the VLSI Era, vol. 1: Silicon Processing, Lattice Press, Sunset Beach, Calif., USA, pp. 8–9,12–13, 21,23–29, 1986.

*Primary Examiner*—Benjamin L. Utech
*Assistant Examiner*—Matthew Anderson
*Attorney, Agent, or Firm*—Oblon, Spivak, McClelland, Maier & Neustadt, P.C.

[57] ABSTRACT

An n-type wafer is provided having a <111> crystal axis in which the resistivity distribution in the surface of the wafer is uniform. The wafer is suitable for use in, e.g., a zener diode. A method is provided for growing a single crystal of n-type silicon doped with a group V element such as phosphorus using the Czochralski method or the floating zone melting (FZ) method wherein the center axis of the silicon single crystal is tilted by a tilt angle of 1–6 degrees from the <111> crystal axis. The silicon single crystal is sliced obliquely at the angle corresponding to the tilt angle to yield an n-type wafer having a <111> crystal axis.

5 Claims, 1 Drawing Sheet

LOCATION IN THE RADIAL DIRECTION

LOCATION IN THE RADIAL DIRECTION

LOCATION IN THE RADIAL DIRECTION

LOCATION IN THE RADIAL DIRECTION

SILICON WAFER AND METHOD FOR PRODUCING THE SAME

BACKGROUND OF THE INVENTION

1. Field of the Invention

The present invention relates to an n-type silicon wafer having a <111> crystal axis suitable for a zener diode and the like, and to a method for producing such a silicon wafer.

2. Discussion of the Background

A zener diode in general has a structure in which an n-type silicon substrate is selectively doped with a p-type impurity. As the n-type silicon substrate, a silicon wafer doped with a group V element, such as phosphorus, is used so that its specific resistance is as low as several milliohms to several ohms. As the silicon wafer, a wafer having a <111> crystal axis is preferred from the viewpoint of electrical properties, in particular its operating resistance, which is normally produced through a growing process by the Czochralski method.

Since the resistivity distribution in the surface of an n-type wafer having a <111> crystal axis is uneven, the use of n-type wafers having a <100> crystal axis or a <511> crystal axis is also considered in some fields (e.g. Japanese Patent Application Laid-Open No. 4-266065).

However, the electrical properties of n-type wafers having <100> or <511> crystal axes are typically inferior to n-type wafers having a <111> crystal axis. Specifically, n-type wafers having <100> or <511> crystal axes can be used only within a certain operating voltage section. Due to this problem, n-type wafers having a <111> crystal axis are still desired as n-type wafers for zener diodes. However, n-type wafers having a <111> crystal axis have the following problems related to the properties of zener diodes.

One of the properties of zener diodes is that their operating voltage sections are divided into very narrow sections. When used as the material for zener diodes, therefore, silicon wafers are required to have an even resistivity distribution in the wafer surface. However, n-type wafers having a <111> crystal axis have a problem that the evenness of the resistivity distribution is essentially poor. Therefore, the yield of good products in the wafers is considerably low.

In order to solve such a problem, it is effective to some extent to reduce the rotation rate of the crucible in the process for growing a single crystal rod, which is the material for silicon wafers, to make the doping element distribution even in the direction of the crystal diameter. In fact, the rotation rate is considerably lower than the rotation rate used in ordinary growing by the Czochralski method. When the rotation rate of the crucible is reduced, however, the convection of the molten silicon tends to transport foreign substances toward the crystal, accelerating the dislocation. Therefore, the yield of single crystals is lowered, and, from this point of view, the rotation rate cannot be greatly reduced.

The uneven distribution of the doping element in a single crystal is more significant as the crystal diameter increases. In order to prevent uneven distribution, further reduction of the rotation rate of the crucible is required, but this accelerates the dislocation.

For these reasons, the resistivity distribution in the surface of an n-type wafer having a <111> crystal axis, as represented by $\Delta\rho=\{(\rho max-\rho min)/\rho min)\}\times 100$, cannot be kept at 10% or less. In addition, the crystal diameter is limited to 4 inches or less.

The above description is not limited to wafers produced by the Czochralski method; the same problems exist in wafers produced by the floating zone melting (FZ) method.

In order to solve these problems in n-type wafers having a <111> crystal axis, a method is known to radiate neutrons in a nuclear reactor to convert a part of an isomer of silicon into phosphorus. However, without doping, this method is expensive. Thus, there still exists a need for providing a practical and inexpensive n-type water having a <111>crystal axis having an even resistivity distribution in its surface.

SUMMARY OF THE INVENTION

One object of the present invention is to provide an n-type wafer doped with a group V element, such as phosphorus, and having a <111> crystal axis and a uniform resistivity distribution in its surface.

In order to achieve the above and other objects of the present invention, the present inventors tilt the center axis of a single crystal slightly.

By tilting the center axis of a single crystal slightly from the <111> crystal axis, the distribution of the quantity of a doping element in the radial direction of the crystal is made uniform. Wafers obliquely sliced from a single crystal at an angle corresponding to the tilt angle (the angle defined by the center axis of the single crystal and the <111> crystal axis) have a <111> crystal axis; since the tilt angle is small, the loss of any material due to tilting is slight. Even without using neutron irradiation, the resistivity distribution in the surface of the doped sliced wafers, represented by $\Delta\rho=\{(\rho max-\rho min)/\rho min\}\times 100$ can be kept at 10% or less.

The first embodiment of the present invention relates to an n-type silicon wafer doped with a group V element, having a <111> crystal axis, and a resistivity distribution in the surface represented by $\Delta\rho=\{(\rho max-\rho min)/\rho min\}\times 100$ of 10% or less.

The second embodiment of the present invention relates to a method for producing a silicon wafer that includes growing a single crystal of n-type silicon doped with a group V element through the use of the Czochralski method or the floating zone melting (FZ) method so that the center axis of the single crystal is tilted by 1–6 degrees from the <111> crystal axis, then slicing a wafer from the grown single crystal obliquely at an angle corresponding to the tilt angle so that the sliced wafer has a <111> crystal axis.

DESCRIPTION OF THE PREFERRED EMBODIMENTS

A more complete appreciation of the invention and many of the attendant advantages thereof will be readily obtained as the same becomes better understood by reference to the following detailed description of the preferred embodiments when considered in connection with the accompanying drawings, which are not intended to be limiting unless otherwise specified.

Figure 1A:
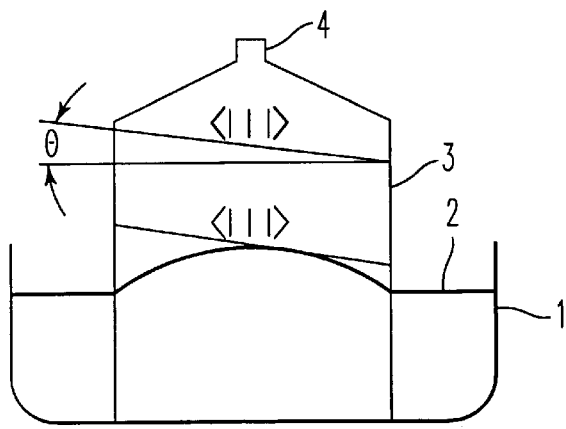
FIG. 1 is a diagram illustrating the embodiments and advantages of the present invention.

In a preferred embodiment of the present invention, as FIG. 1(a) shows, a silicon single crystal 3 is grown from molten silicon 2 doped with a predetermined level of a group V element, such as phosphorus, arsenic, nitrogen, and antimony in a crucible 1 by the Czochralski method. At this time, a seed crystal 4 the center axis of which is tilted by 1–6 degrees (tilt angle θ) from the <111> crystal axis is used. The seed crystal is applied according to methods known in the art. Thus, the center axis of the grown silicon single crystal 3 is tilted by 1–6 degrees from the <111> crystal axis. Due to such tilting, the quantitative distribution of the doping element in the single crystal is made even in the radial direction of the crystal.

The reason why the quantitative distribution of the doping element in the single crystal is made even in the radial direction of the crystal by tilting the center axis of the crystal by 1–6 degrees from the <111> crystal axis is believed to be as follows:

Uneven distribution of the quantity of the doping element in the radial direction of the crystal in the silicon single crystal 3 is believed to result from the variation in the coefficient of segregation in the radial direction of the crystal due to the effects of the rotation rate of the silicon single crystal 3 and the solidifying rate of molten silicon 2.

Figure 1B:

That is, the silicon single crystal 3 grown from molten silicon 2 rotates around the axis relative to molten silicon 2, and, as a result, the circumferential speed of the silicon single crystal 3 is lower at the central portion, and higher at the periphery of the crystal. The quantity of the doping element that is incorporated in the silicon single crystal 3 from molten silicon 2 depends upon the coefficient of segregation, and the coefficient of segregation tends to increase as the relative circumferential speed at the solidifying interface of the single crystal decreases. Because of this tendency, the concentration of the doping element in the silicon single crystal 3 is higher at the central portion of the crystal. The result on the resistivity distribution in the surface of the wafer is that the resistance decreases toward the central portion of the crystal where the concentration of the doping element is high, as FIG. 1(b) shows. Since this phenomenon is not affected by the direction of the crystal axis, it occurs not only in wafers having a <11> crystal axis, but also in wafers having <100> or <511> crystal axes. Furthermore, it occurs similarly when the center axis of the crystal is tilted by 1-6 degrees from the <111> crystal axis.

Figure 1C:

Whereas the effect of the solidifying rate of the molten silicon 2 is controlled by the direction of the crystal axis, in the silicon single crystal 3 having a <111> crystal axis, since linkage between atoms in the lateral direction perpendicular to the center axis is strong, the crystal growth rate in the lateral direction is high. Here, since the solidifying interface of the single crystal is normally an upwardly convex surface, the solidifying rate at the horizontal top area is higher than the solidifying rate on other areas. The higher the solidifying rate, the less the doping element is discharged from the crystal into the melt. The larger the coefficient of segregation is, the larger the concentration of the doping element becomes in the silicon single crystal 3 having a <111> crystal axis in the area closer to the central portion of the crystal. The effect on the resistivity distribution in the surface of the wafer is that the resistance decreases toward the central portion of the crystal where the concentration of the doping element is high, as FIG. 1(c) shows. Since this phenomenon is unique in a <111> crystal axis, the resistivity at the central portion of the wafer having a <111> crystal axis is greatly reduced due to the effect of the rotation of the single crystal, as described above, and the effect of the solidifying rate, and the resistivity distribution in the surface becomes very uneven. This is the reason why the resistivity distribution is extremely uneven in a conventional wafer having a <111> crystal axis.

The reason why the resistivity distribution in the surface of wafers having <100> or <511> crystal axes is even is that an extreme decrease in resistivity at the central portion, which is unique to the <111> crystal axis, does not occur in these wafers. However, these <100> or <511> wafers are not suitable as the material for zener diodes from the point of view of electrical properties as described above.

On the other hand, in the case of growing a silicon single crystal 3 according to the invention wherein the center axis is slightly tilted from the <111> crystal axis as shown in FIG. 1(a), the portion of a high solidifying rate, that is, the portion of the high concentration of the doping element, moves laterally from the central portion of the crystal due to this tilting. Therefore, with respect to the resistivity distribution in the surface of the wafer, the resistance decreases at two locations at both sides of the central portion of the crystal as FIG. 1(d) shows, and the problem of resistance decrease at the central portion has been solved.

Figure 1D:
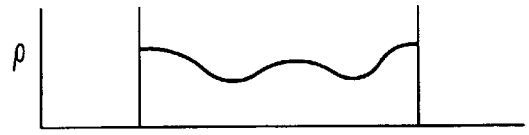
Figure 1E:
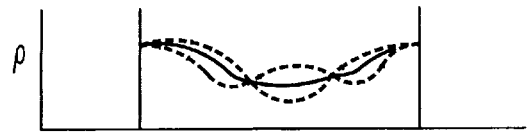

Since, in a silicon single crystal 3 having a center portion slightly tilted from the <111> crystal axis, the effect shown in FIG. 1(c) overlaps with the effect shown in FIG. 1(d) resulting in the distribution of the doping element as shown by the solid line in FIG. 1(e), and an increase in the doping element concentration in the central portion of the crystal is lessened. Thus, the concentration distribution of the doping element in the radial direction of the crystal is made significantly even, when compared with the silicon single crystal having a <111> crystal axis aligned with the center. This is why the quantitative distribution of the doping element in the radial direction of the crystal according to the invention becomes even by tilting the center axis of the crystal by 1–6 degrees from the <111> crystal axis.

When a silicon single crystal 3, the center axis of which is slightly tilted from the <111> crystal axis has been grown, is obliquely sliced at an angle corresponding to the tilt angle to form silicon wafers having a <111> crystal axis, according to the present invention, an even resistivity distribution in the surface corresponding to the concentration distribution of the doping element in the silicon single crystal 3 is obtained. As a result, an n-type wafer having a <111> crystal axis of a $\Delta \rho$ of 10% or less, which cannot be achieved in the doping type, is produced.

Moreover, since the crucible 1 does not need to rotate at an extremely low rate because of the even distribution of the doping element concentration in the silicon single crystal 3, the dislocation is inhibited, and the yield of the dislocation-free single crystal is improved. Also, the growth of single crystals having as large a diameter as 5 inches or more becomes possible.

Preferably, the crucible rotation rate is greater than 0.3 rpm, more preferably more than 0.8 rpm, more particularly preferably more than 2 rpm, more especially preferably more than 5 rpm, most preferably more than 6–8 rpm, most especially preferably more than 9–10 rpm.

Preferably, the single crystal diameter is 4 inches or more. More preferably the single crystal diameter is 5 inches or more.

Furthermore, since the tilt angle of the center axis of the silicon single crystal 3 from the <111> crystal axis is small, the tilt angle of slicing the crystal to form wafers is also small, and the loss of the material due to oblique slicing is prevented. Also, since the ellipticity of the sliced wafer is slight, the loss of the material due to ellipticity is minimized.

In the case of a <511> crystal axis for the reference, since it is tilted by 15 degrees or more from the <111> crystal axis, the loss of the material due to oblique slicing and due to ellipticity becomes significant even if wafers having a <111> crystal axis are obtained.

The reason why the tilt angle is preferably limited to 1–6 degrees in the method for producing wafers according to the present invention is that if the tilt angle is less than 1 degree, the resistivity distribution in the surface of the wafer cannot be sufficiently even, and if the tilt angle exceeds 6 degrees, the loss of the material due to oblique slicing and due to ellipticity becomes significant. An especially preferred tilt angle is a lower limit of 2 degrees or more and an upper limit of 5 degrees or less. More especially preferred is a tilt angle between 3 and 4 degrees. These tilt angle ranges include all values and subranges therebetween, including 1.2, 5.9, 2.5, and 3.5.

EXAMPLES

Having generally described this invention, a further understanding can be obtained by reference to the following examples, which are provided for purposes of illustration, and are not intended to be limiting unless otherwise specified.

Phosphorus doped 4-inch and 5-inch silicon single crystals for zenor diodes were grown under the conditions shown in Tables 1 and 2. The yield of dislocation-free crystals in crystal growth, and the resistivity $\rho$ in the surface of wafers taken from the top, central, and bottom portions of the grown crystals are shown in Table 2.

The mean value of the resistivity $\rho$ in the surface of wafers taken from the top, central, and bottom portions of the grown crystals are shown in Table 2.

The mean value of the resistivity $\rho$ lowers gradually from the top portion to the bottom portion with the change in the passage of time in the phosphorus concentration in the melt. The distribution of the resistivity $\rho$ is represented by $\Delta\rho=\{(\rho max-\rho min)/\rho min\}\times 100\%$.

TABLE 1

| Crystal Diameter | 4 inches | 5 inches |
| --- | --- | --- |
| Crystal pulling rate | 1.0 mm/min | 0.9 mm/min |
| Tilt angle of center axis of crystal | See Table 2 | See Table 2 |
| Crystal rotation rate | 25 rpm | 25 rpm |
| Crucible rotation rate | See Table 2 | See Table 2 |
| Pressure in crucible | 1330 pa | 1330 pa |
| Atmosphere in crucible | Ar gas | Ar gas |
| Crystal pulling length | 1000 mm | 1000 mm | crystal was sliced in the direction perpendicular to the central axis to obtain n-type wafers having a <111> crystal axis.

The resistivity distribution in the surface of the thus obtained Conventional Example wafers was 11% at a minimum. The mean yield of dislocation-free crystals in the growing process for 45 crystals was 27%.

In Comparative Example 1, a 4-inch single crystal was grown. The center axis had a tilt angle from the <111> crystal axis of 0 degrees and coincided with the crystal axis. The rotation rate of the crucible was higher than that of the Conventional Example (10 rpm) in order to elevate the yield of dislocation-free crystals. The grown silicon single crystal was sliced in the direction perpendicular to the central axis to obtain 4-inch n-type wafers having a <111> crystal axis.

Since the rotation rate of the crucible was raised, the mean yield of dislocation-free crystals in the growing process for 12 crystals was improved to 83%. However, the resistivity distribution in the surface of the thus obtained Comparative Example 1 wafers was much more uneven than in the Conventional Example, and was 16% at a minimum.

In Comparative Example 2, a 5-inch single crystal was grown. The center axis had a tilt angle from the <111> crystal axis of 0 degrees and coincided with the crystal axis. The rotation rate of the crucible was lower than in the Conventional Example (0.3 rpm) because the diameter of the single crystal was increased. The grown silicon single crystal was sliced in the direction perpendicular to the central axis to obtain 5-inch n-type wafers having a <111> crystal axis.

The resistivity distribution in the surface of the thus obtained Comparative Example 2 wafers was 12% at a minimum, almost the same as that of the Conventional Example, and still exceeded 10%. The mean yield of dislocation-free crystals in the growing process for 9 crystals was markedly lowered to 11% because of the low rotation rate of the crucible. Due to this low yield, practical operation is impossible.

TABLE 2

|  | Conventional Example | Comparative Example 1 | Comparative Example 2 | Example 1 | Example 2 | Example 3 | Example 4 |
| --- | --- | --- | --- | --- | --- | --- | --- |
| Crystal diameter | 4 inches | 4 inches | 5 inches | 4 inches | 4 inches | 4 inches | 5 inches |
| Tilt angle of crystal center axis | 0° | 0° | 0° | 5° | 5° | 1° | 5° |
| Crucible rotation rate | 0.8 rpm | 10 rpm | 0.3 rpm | 0.8 rpm | 7 rpm | 7 rpm | 7 rpm |
| Resistivity in the surface $\rho$ |  |  |  |  |  |  |  |
| Top |  |  |  |  |  |  |  |
| Mean | 23.6* | 23.8* | 23.5* | 24.0* | 23.2* | 23.5* | 23.3* |
| $\Delta\rho$ | 11% | 23% | 12% | 6% | 8% | 4% | 8% |
| Center |  |  |  |  |  |  |  |
| Mean | 16.5* | 16.6* | 16.0* | 16.8* | 16.0* | 15.9* | 16.1* |
| $\Delta\rho$ | 15% | 16% | 13% | 3% | 3% | 6% | 4% |
| Bottom |  |  |  |  |  |  |  |
| Mean | 14.0* | 14.5* | 14.1* | 14.7* | 14.2* | 14.0* | 14.5* |
| $\Delta\rho$ | 13% | 27% | 15% | 2% | 5% | 9% | 5% |
| Yield of dislocation-free crystals | 27% | 83% | 11% | 25% | 75% | 88% | 70% |

*m$\Omega \cdot$ cm

In the Conventional Example, a 4-inch single crystal was grown according to conventional growing conditions. The center axis had a tilt angle from the <111> crystal axis of 0 degrees and coincided with the crystal axis. The rotation rate of the crucible was 0.8 rpm. The grown silicon single In Example 1, a 4-inch single crystal was grown according to the invention. The center axis was tilted at an angle of 5 degrees from the <111> crystal axis. The rotation rate of the crucible was 0.8 rpm, the same as in the Conventional Example. The grown silicon single crystal was obliquely sliced at an angle of 5 degrees from the center axis to obtain 4-inch n-type wafers having a <111> crystal axis according to the invention.

The mean yield of dislocation-free crystals in the growing process for 8 crystals was 25% because the rotation rate of the crucible was the same as that of the Conventional Example; however, the resistivity distribution in the surface of the thus obtained Example 1 wafers was 6% at a maximum, which is significantly more even than the Conventional Example.

In Example 2, a 4-inch single crystal was grown according to the invention. The center axis was tilted at an angle of 5 degrees from the <111> crystal axis as in Example 1. The rotation rate of the crucible was higher than in the Conventional Example (7 rpm). The grown silicon single crystal was obliquely sliced at an angle of 5 degrees from the central axis to obtain 4-inch n-type wafers having a <111> crystal axis according to the invention.

The mean yield of dislocation-free crystals in the growing process for 8 crystals was improved to 75%, because the crucible was rotated at a higher rate than in the Conventional Example. The resistivity distribution in the surface of the thus obtained Example 2 wafers was 8% at a maximum despite the high rotation rate of the crucible, and the target value of 10% or less was achieved.

In Example 3, a 4-inch single crystal was grown according to the invention. The center axis was tilted at an angle of 1 degree from the <111> crystal axis. The rotation rate of the crucible was 7 rpm as in Example 2. The grown silicon single crystal was obliquely sliced at an angle of 1 degree from the central axis to obtain 4-inch n-type wafers having a <111> crystal axis according to the invention.

The mean yield of dislocation-free crystals in the growing process for 8 crystals was improved to 88%, because the crucible was rotated at a higher rate than in the Conventional Example. The resistivity distribution in the surface of the thus obtained Example 3 wafers was 9% at a maximum despite the high rotation rate of the crucible.

In Example 4, a 5-inch single crystal was grown according to the invention. The center axis was tilted at an angle of 5 degrees from the <111> crystal axis as in Examples 1 and 2. The rotation rate of the crucible was 7 rpm as in Examples 2 and 3. The grown silicon single crystal was obliquely sliced at an angle of 5 degrees from the central axis to obtain 5-inch n-type wafers having a <111> crystal axis according to the invention.

The resistivity distribution in the surface of the thus obtained Example 4 wafers was 8% at a maximum despite the large diameter (a 5-inch wafer), and the target value of 10% or less was achieved. The mean yield of dislocation-free crystals in the growing process for 10 crystals was improved to 70% similar to Example 2. This is the yield level which enables practical operation.

As described above, since the silicon wafer of the present invention is a doped type wafer doped with a group V element, having excellent uniformity of surface resistivity distribution and excellent yield, the manufacturing costs of zener diodes may be significantly reduced. In addition, the method for producing wafers of the present invention contributes to the further reduction of the manufacturing costs of zener diodes by inhibiting the loss during wafer slicing in silicon wafer production.

This application is based on Japanese Patent Application Number HEI 9-367434, filed Dec. 24, 1997, the entire contents of which are hereby incorporated by reference.

Having now fully described the invention, it will be apparent to one of ordinary skill in the art to which this invention pertains that many changes and modifications may be made thereto without departing from the spirit or scope of the invention as set forth herein.

What is claimed as new and desired to be secured by Letters Patent in the United States is:

1. A method for producing a silicon wafer, comprising:
   growing a single crystal of n-type silicon doped with a group V element with the Czochralski method to obtain a grown single crystal;
   wherein said single crystal is grown from a seed crystal, said seed crystal comprising a center axis and a <111> crystal axis, wherein said center axis of said seed crystal is tilted by a tilt angle of 1–6 degrees from said <111> crystal axis of said seed crystal; and
   wherein a center axis of the grown single crystal is tilted by a tilt angle of 1–6 degrees from the <111> crystal axis; and
   slicing the grown single crystal obliquely at an angle corresponding to the tilt angle to obtain a sliced wafer having a <111> crystal axis.

2. The method of claim 1, wherein the tilt angle is between 2 and 5 degrees.

3. The method of claim 1, wherein the tilt angle is between 3 and 4 degrees.

4. The method of claim 1, further comprising growing the single crystal at a crucible rotation rate of more than 2 rpm.

5. The method of claim 1, further comprising growing the single crystal at a crucible rotation rate of more than 10 rpm.

* * * * *